(12) United States Patent  
Momonoi et al.

(10) Patent No.: US 6,643,893 B2
(45) Date of Patent: Nov. 11, 2003

(54) APPARATUS FOR CLEANING SEMICONDUCTOR WAFERS IN A VACUUM ENVIRONMENT

(75) Inventors: Yoshinori Momonoi, Kokubunji (JP); Kenetsu Yokogawa, Tsurugashima (JP); Masaru Izawa, Hino (JP); Shinichi Tachi, Sayama (JP)

(73) Assignee: Hitachi, Ltd., Tokyo (JP)

(*) Notice: Subject to any disclaimer, the term of this patent is extended or adjusted under 35 U.S.C. 154(b) by 17 days.

(21) Appl. No.: 09/809,202

(22) Filed: Mar. 16, 2001

(65) Prior Publication Data

US 2002/0092121 A1 Jul. 18, 2002

(30) Foreign Application Priority Data

Jan. 16, 2001 (JP) ........................................ 2001-007157

(51) Int. Cl.$^7$ ............................ B08B 11/00; B08B 11/02
(52) U.S. Cl. ............................ 15/303; 15/316.1; 15/77; 15/102
(58) Field of Search ................ 15/303, 310, 316.1, 15/301, 345, 77, 88.2, 102; 134/1.2, 37, 21

(56) References Cited

U.S. PATENT DOCUMENTS

| | | | | | |
|---|---|---|---|---|---|
| 5,361,449 A | * | 11/1994 | Akimoto | ...................... | 15/302 |
| 5,413,954 A | * | 5/1995 | Aydil et al. | .................... | 117/97 |
| 5,849,135 A | * | 12/1998 | Selwyn | .................. | 156/345.47 |
| 6,148,471 A | * | 11/2000 | Kern et al. | .................... | 15/303 |
| 6,308,361 B1 | * | 10/2001 | Matsuda et al. | .............. | 15/102 |
| 6,336,846 B1 | * | 1/2002 | Park et al. | ..................... | 451/41 |
| 6,436,303 B1 | * | 8/2002 | Kim et al. | ..................... | 216/67 |
| 6,490,746 B1 | * | 12/2002 | Ernst et al. | ................... | 15/1.51 |
| 2002/0152636 A1 | * | 10/2002 | Ernst et al. | .................... | 34/487 |

FOREIGN PATENT DOCUMENTS

| | | |
|---|---|---|
| JP | 8-85887 | 4/1996 |
| JP | 8-131981 | 5/1996 |
| JP | 9-17776 | 1/1997 |
| JP | 10-294261 | * 11/1998 |

\* cited by examiner

*Primary Examiner*—Terrance R. Till
(74) *Attorney, Agent, or Firm*—Mattingly, Stanger & Malur, P.C.

(57) ABSTRACT

A dry cleaning device, wherein a pad is moved towards a surface of a wafer, cleaning gas is injected into a space formed between the pad and the wafer to generate a high-speed gas flow along the surface of the wafer whereby particles left on the surface of the wafer are removed with the high-speed gas flow. In addition, in order to assist this physical cleaning action, either a chemical or an electrical cleaning method such as a plasma additionally may be used.

25 Claims, 10 Drawing Sheets

APPARATUS FOR CLEANING SEMICONDUCTOR WAFERS IN A VACUUM ENVIRONMENT

BACKGROUND OF THE INVENTION

1. Field of the Invention

This invention relates to a wafer cleaning apparatus in a manufacturing stage for a semiconductor device, and more particularly a technology for removing particles left on the wafer surface within a vacuum environment after processing or after flattening at a pre-stage of the semiconductor manufacturing process.

2. Description of the Related Prior Art

In the prior art cleaning for a semiconductor wafer (hereinafter abbreviated as a wafer), the cleaning operation is carried out such that either pure water or a solution diluted with various kinds of acids or an alkaline solution is applied. The wafer is immersed in the solution or the solution is blown against the wafer to wash away particles at the surface of the wafer. In addition, a method for mechanically cleaning the wafer surface with a brush concurrently with immersion of the wafer in the solution or the like is also used.

The aforesaid cleaning method of the prior art shows the following problems due to the fact that this is a so-called wet cleaning method in which basically water is used for cleaning operation.

1) Although a continuous total processing within a vacuum environment such as a dry etching or a plasma CVD or the like increases a machining precision or manufacturing efficiency, cleaning operation required after each of the processings is a wet type processing, so that it generates a necessity for once putting out the wafer into atmosphere and thus the aforesaid effects may not be attained.
2) The wet cleaning operation requires a rinsing stage and a drying stage in addition to the cleaning operation, resulting in that the number of manufacturing stages is increased.
3) In the case of wet cleaning operation, the local surface of the semiconductor material is degraded in its quality and as the size of a semiconductor is made fine, its yield is reduced by the degraded material quality at the surface.
4) In the case of performing the wet cleaning operation, liquid is not sufficiently immersed on small structural parts sometimes due to a surface tension of liquid and cleaning power with respect to the small structural part is insufficient.
5) A high performance device has required high wet-absorbing material such as organic film or porous organic film as a new material for a semiconductor device, and, in particular, an insulating film material as a new material in the future. In the case of manufacturing the semiconductor device using these new materials, either the wet cleaning or a mere occasional exposure in the surrounding atmosphere causes a characteristic of the device to be deteriorated.
6) A wet cleaning is normally carried out under a batch processing. In the case that the wafer has 300 mm φ (diameter) or more, it takes much time in cleaning of the wafer and handling before and after the cleaning.

In turn, as a cleaning method in place of the aforesaid wet cleaning operation, there is provided a dry cleaning method. As to the dry cleaning method, this method has been disclosed in Japanese Patent Laid-Open Nos. Hei 8-131981, 8-85887 or 9-17776, for example.

SUMMARY OF THE INVENTION

It is an object of the present invention to provide a dry cleaning device capable of attaining a cleaning power corresponding to the wet processing even in cleaning within a vacuum environment in order to solve the problems accompanied with the aforesaid wet cleaning.

A summary of the disclosed invention that is a representative one of the disclosed inventions will be described in brief as follows.

The present invention is characterized in that the particles left at the surface of the wafer are physically removed with a high-speed gas flow by a method wherein a pad or block is moved near the surface of the wafer, gas is injected into a clearance or space between the pad and the surface of the wafer and a high speed gas flow along the surface of the wafer is generated.

DESCRIPTION OF THE PREFERRED EMBODIMENTS

Figure 1:
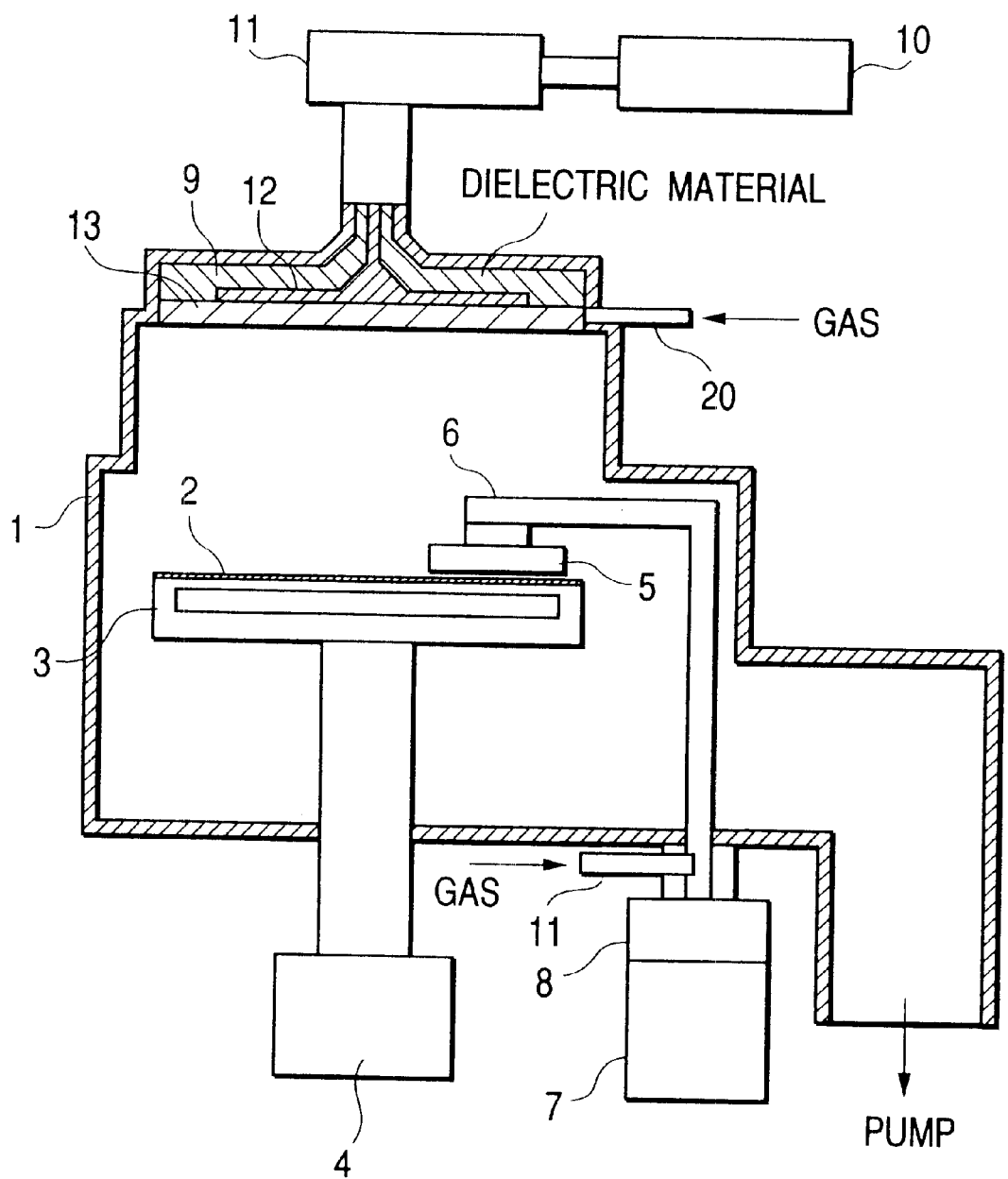
FIG. 1 is a basic configuration view showing a preferred embodiment 1 of the present invention.

Referring now to the drawings, some preferred embodiments of the present invention will be described in detail as follows.

(Preferred Embodiment 1)

A first preferred embodiment of the present invention and its operation will be described as follows. An object to be cleaned here is a circular semiconductor wafer with a diameter of about 300 mm φ (diameter).

In FIG. 1 is shown a basic configuration view of a first preferred embodiment of the present invention. Within a vacuum container 1 having a vacuum evacuating means such as a pump for evacuating the container, are installed a wafer mounting means 3 for mounting a wafer 2, a pad or block 5 and a supporting section 6. The wafer mounting means 3 is connected to a rotating mechanism 4 for rotating the wafer 2 in a circumferential direction. The pad 5 is connected to the supporting section 6. The supporting section 6 is further connected to an actuator 7 capable of performing an up-and-down motion for changing a space between the pad 5 and the wafer 2, and capable of sliding the pad 5 on and over the surface of the wafer 2. A weight sensor 8 for sensing an applied load acted between the pad 5 and the wafer 2 produced by the up and-down motion is mounted at the actuator 7, thereby enabling the size of a space between the pad 5 and the wafer 2 to be varied. A temperature control means 19 is mounted on the wafer mounting means 3 so as to enable a temperature of the wafer 2 to be controlled within a range from a room temperature to 300° C. A plasma generating means 9 is arranged at the upper part of the vacuum container 1. In the preferred embodiment, a plasma generating means using an electromagnetic wave in a UHF band is used. The electromagnetic wave in the UHF band passes from a UHF power supply 10 through an alignment unit 11, passes from a plane antenna 12 through a dielectric material window 13 sealingly closing the vacuum chamber and is guided into the vacuum container. In the preferred embodiment, an electromagnetic wave in the UHF band is applied at the plasma generating means. However, the plasma generating means using an electromagnetic wave in a micro-wave band or an electromagnetic wave in a radio frequency band may be additionally applied and further, a similar effect can be attained by applying a magnetic field to the plasma generating means operated under these electromagnetic waves to generate plasma. In brief, whatever type of means capable of generating plasma may be applied, any type of methods may have a similar effect. The wafer 2 is arranged within a diffusion area of plasma generated by the plasma generating means 9. Arranging the wafer 2 within the diffusion area enables excessive damage or the like caused by plasma to be prevented from being applied to the wafer 2.

A washing process performed by the first preferred embodiment will now be described.

After mounting the wafer 2 inside the vacuum container 1, a vacuum is created in the container by a vacuum evacuating means. Similar effect can be attained if, after creating a vacuum in the container, the wafer 2 is mounted therein. Then, the wafer 2 is rotated by the rotating mechanism 4 in a circumferential direction together with the wafer mounting means 3. In the case of the preferred embodiment, a rotating speed of the wafer 2 is 200 rpm. In addition, a temperature of the wafer is set to 100° C. by the temperature control mechanism 19. Increasing the temperature of the wafer 2 enables a chemical reaction efficiency at the surface of the wafer 2 to be increased and a washing efficiency to be increased. After rotation of the wafer 2, Ar gas is injected through the pad 5 at a flow rate of 20 litter/min. The pad 5 on the wafer 2 is moved to a position where it may not be contacted with the wafer 2 under an oscillating motion of the actuator 7. Concurrently, plasma of mixture gas of Ar and CF fed through a second gas feeding means 20 separately arranged and a mixture gas of Ar gas fed through the pad 5 is generated by the plasma generating means 9. After production of plasma, the pad 5 is moved near the wafer 2 through up-and-down motion of the actuator 7. At this time, a force applied between the pad 5 and the wafer 2 is detected by the weight sensor 8 so as to control the size of a space between the surface of the pad 5 and the surface of the wafer 2. The space between the pad surface and the surface of the wafer 2 thus becomes filled with high pressure gas with AR gas supplied through the pad 5. Thus, even if the pad 5 is not in contact with the wafer, an applied load is generated between the pad 5 and the wafer 2, so that the applied load is detected by the weight sensor 8 so as to enable a space between the surface of the pad 5 and the surface of the wafer 2 to be controlled. As the weight sensor 8, a piezo-electric element, a strain gauge, a spring, a resilient member, a weight or a combination of these members may be employed. In this way, high-speed gas flow is generated in the clearance or space between the pad 5 and the wafer 2 to enable some particles at the surface of the wafer 2 to be removed. In the preferred embodiment, a clearance between the surface of the pad and the surface of the wafer is controlled to be 5 to 20 μm. However, setting a range of clearance between the surface of the pad and the surface of the wafer of 1 to 100 μm may also be effective. A high-speed gas flow can be generated with the same volume of gas as a clearance between the surface of the pad and the surface of the wafer is made smaller. Accordingly, a higher cleaning power can be attained. However, when the clearance between the pad and the wafer is made smaller, it becomes difficult to keep the clearance constant. If the pad and the wafer come into contact with each other, there is a possibility that a damage will occur to the surface of the wafer.

In the preferred embodiment, Ar gas is used as gas supplied through the pad 5. Other suitable gases are nitrogen, He, Xe and Ne and the like.

In the preferred embodiment, a flow rate of gas flowing between the pad 5 and the wafer 2 is set to 20 litter/min. However, a similar effect can be attained even under a flow rate of 0.5 to 500 litters/min. An increased amount of gas flow rate enables the cleaning power to be increased but an increased amount of consumed gas also increases the cost. The range of 0.5 to 500 litters/min., however, is a practical range.

Figure 5:
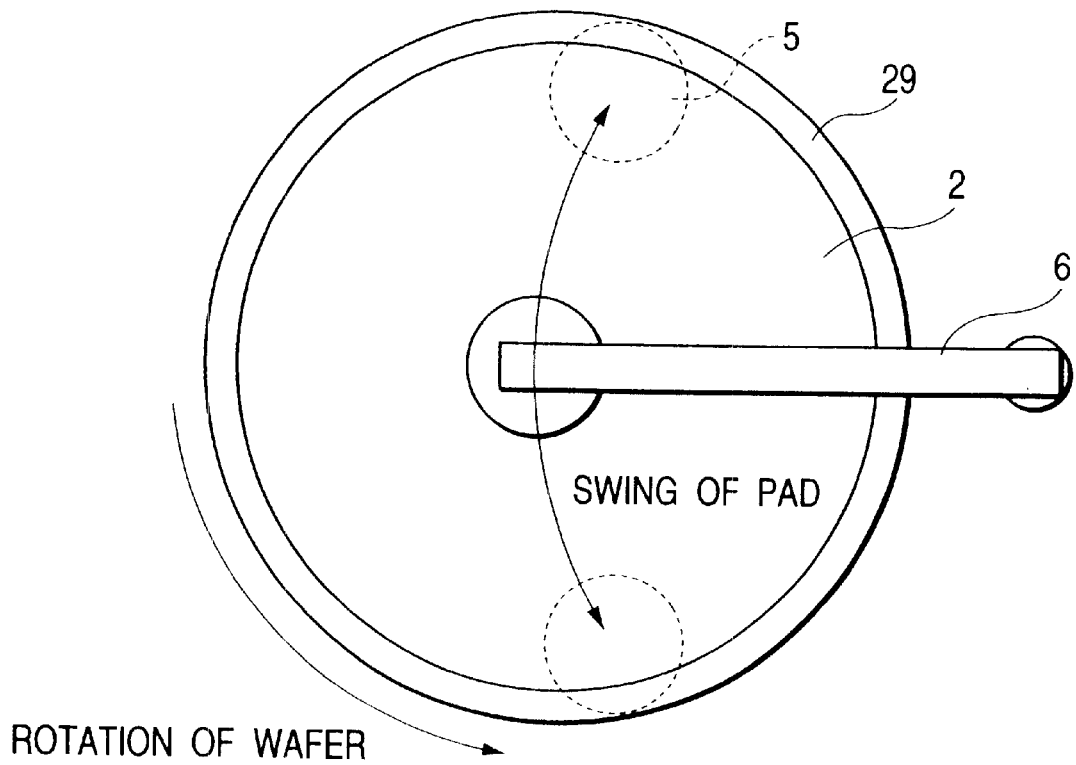
FIG. 5 is a view showing a scanning method of a pad on a wafer in preferred embodiment 1.

In FIG. 5 is shown a method for scanning or moving of the pad 5 on the wafer 2. After a clearance between the pad 5 and the wafer 2 reaches a set value, the pad 5 is swung on the wafer 2 by the actuator 7. An outer diameter of the pad 5 applied in the preferred embodiment of the present invention is smaller than that of the wafer 2. In view of this fact, an entire surface of the wafer 2 is scanned by the pad 5 by using both the swing motion and the rotation of the wafer 2. In the preferred embodiment of the present invention, although the rotating mechanism 4 for use in rotating the wafer is used, additionally, a similar effect can be attained even in the case that a mechanism for rotating the pad 5 or a mechanism for rotating the wafer 2 and a mechanism for rotating the pad 5 are used together.

Figure 6:
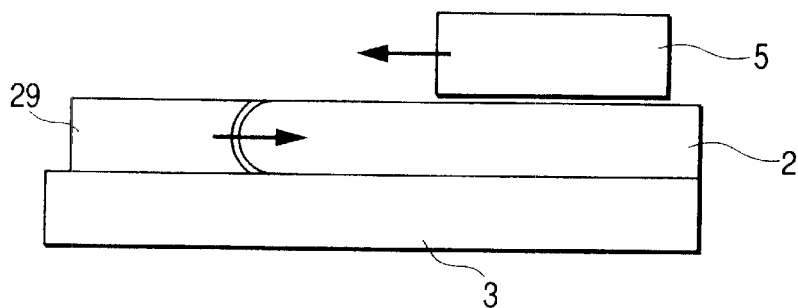
FIG. 6 is a view showing a method for holding a wafer in preferred embodiment 1.

A wafer holding section 29 shown in FIG. 6 is mounted on the wafer mounting means 3 to hold the wafer 2. FIG. 6 shows a case that the wafer 2 is a Si wafer. The wafer holding section 29 holds the wafer 2 by pushing it from a lateral side. In order to enable the peripheral part of the wafer 2 to be cleaned, the wafer holding section 29 has no step in regard to the wafer 2 and the pad 5 can perform a scanning operation on the wafer holding section 29. In order to equalize a cleaning power at the central part of the wafer 2 and a cleaning power at its peripheral part, an oscillating speed of the pad 5 or a rotating speed of the wafer 2 is made variable. For example, the rotating speed of the wafer 2 in the preferred embodiment is slower at the central part of the wafer as compared with that at the peripheral part. In view of this fact, the swing speed of the pad 5 at the central part of the wafer 2 is made faster than a swing speed at the peripheral part of the wafer 2. The swing speed is set such that a staying time of the pad 5 on the wafer 2 at the central part of wafer 2 is made equal to that at the peripheral part of the wafer 2. With such an arrangement as above, the time required for washing at the central part of the wafer and the time required for washing at the peripheral part of the wafer become equal to each other, resulting in the through-put of the wafer being improved.

Figure 2:
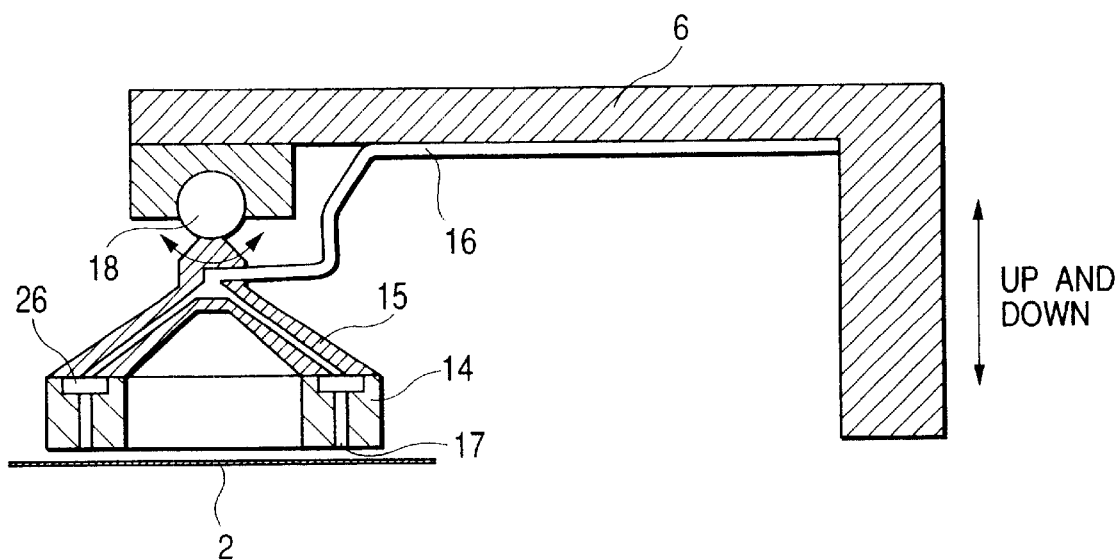
FIG. 2 is a view showing a pad or block in a preferred embodiment 1 of the present invention.
Figure 3:
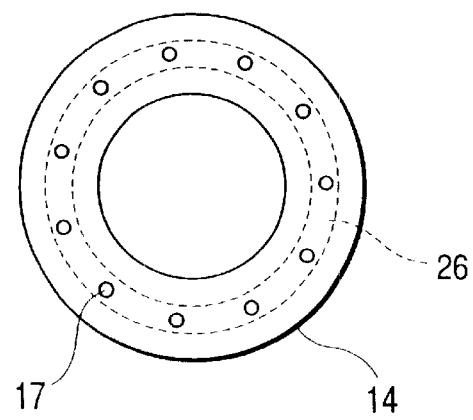
FIG. 3 is a view showing a pad in a preferred embodiment 1 as seen from a bottom thereof.
Figure 4:
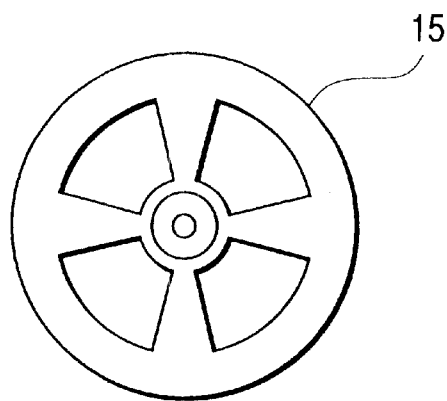
FIG. 4 is a view showing a pad supporter the top of the supporter in preferred embodiment 1.

In FIG. 2 is shown an illustration of the pad 5. The pad 5 is comprised of a pad 14 formed by TEFLON material near the wafer 2; a pad supporting section 15; and a gas feeding passage 16. In FIG. 3 is shown a view as seen from the bottom of the pad section 14. In the preferred embodiment, a plurality of gas injection ports 17 branched from a supply passage 26 are arranged on a circumference at an outer peripheral part of the pad and the central part of the pad is of an annular structure. In FIG. 4 is shown a view for showing the pad supporting section 15 from the top thereof. The pad supporting section 15 is of a structure having windows therein, wherein gas flowed to the central section of the pad 14 through the windows can be passed into the vacuum container 1. As described above, when the pad 14 and the wafer 2 are moved towards each other to improve the washing power by increasing the flow rate of the gas, there occurs a possibility that they may contact each other. In order to cause the pad 14 and the wafer 2 to be easily moved towards each other, it is important that an angle between the pad and the wafer is controlled so that adjacent planes of the pad and the wafer are always kept parallel to each other. In order to realize this arrangement, the pad supporting section 15 is connected to the supporting section 15 by the pad connecting section 18 and its connecting angle can be freely changed. This structure can be comprised of a spherical surface bearing, an air damper and a resilient member or the like. Further, gas flowing through a gas feeding passage 16, is branched within the pad supporting section 15 and the supply passage 26, so that the gas is injected from each of the gas injection ports 17 arranged at the peripheral section of the pad section 14. The gas feeding passage 16 has a structure such that a connecting angle between the pad supporting section 15 and the supporting section 6 is movable. With such an arrangement as above, if gas pressure is increased and causes the pad 5 to be inclined the wafer 2, the pad 5 is pushed back, an inclination angle of the pad 5 in respect to the wafer 2 is automatically corrected and contact between both members is avoided.

In the preferred embodiment, although TEFLON material is used for the pad section 14 of the pad 5, it is apparent that a similar effect to that described above can be attained even if polyvinyl alcohol, DELRIN, BESPEL, KAPTON, polyvinyl chloride, polyester, silicon oxide, silicon, and aluminum oxide and the like are applied. Basically, it is desirable that, as the material of the pad section 14, a softer material than that at the surface of the wafer 2 is applied. If the material of the pad section 14 is of a resilient material 6 which can be deformed into a corrugated shape due to a gas pressure variation at a clearance between the pad section 14 and the wafer 2, deformation of the pad section 14 enables contact between the pad section 14 and the wafer 2 to be avoided. To avoid particles being left at the surface of the wafer at the pad section 14, it is desirable that that the surface of the wafer be as flat as possible. In turn, the surface of the pad section 14 facing the wafer may be formed into a corrugated shape to enable turbulence to be generated in the gas flow and its cleaning power improved. In the case that some particles are left at the surface of the pad section 14, either the pad section is replaced with another one or a cleaning mechanism for the surface of the pad section is installed to enable the wafer to be continuously cleaned.

A part of the particles removed from the wafer 2 is gasified within the vacuum container 1 with plasma and evacuated. The residual particles are removed through the evacuating port together with discharged gas. In the preferred embodiment shown in FIG. 1, in order to perform an efficient removal of particles, gas fed from the second gas feeding means 20 is injected out in a shower form from dielectric windows 13 with a shower plate structure having many gas injection ports mounted therein. A gas flow from the wafer 2 to the gas discharging port is formed by the shower-like gas flow and some particles in the vacuum container 1 are efficiently transported to the discharging port. Gas fed by the second gas feeding means has the two functions of forming the aforesaid plasma and of transporting the aforesaid particles. In addition it is also possible to design the shape of the vacuum container and the position of the gas blowing-out port and to form a gas flow for performing the most efficient transportation of removed particles to the gas discharging port. Further, the inner wall surface of the vacuum container is heated to prevent the particles from being re-adhered to the inner wall surface. Additionally, a filter is arranged within the gas discharging passage to prevent the particles from being mixed into the gas discharged from the cleaning device.

The function of the pad 5 in the cleaning process is mainly to apply a physical force to the particles adsorbed at the surface of the wafer 2 to remove the particles. However, if the pad 5 is directly contacted with the surface of the wafer 2, the acting physical force is too high and damage is produced at the surface of the wafer. Due to this fact, in the preferred embodiment, gas is flowed between the pad 5 and the wafer 2 and a physical force is indirectly applied against the surface of the wafer 2 through the gas layer. When a gas flow is generated between the pad 5 and the wafer 2, a frictional stress of the gas flow is applied to the surface of the wafer 2 and a high moving force is generated without contacting the surface of the wafer. Further, when the pad 5 and the wafer 2 are moved close to each other, the gas is fed into a minute clearance, whereby a high-speed gas flow having a cleaning power over a wide range can be produced. The cleaning power caused by the gas flow speed is determined by the size of the clearance and the gas flow rate, so that by controlling the force applied between the pad 5 and the wafer 2 and the gas flow rate, the cleaning power can be controlled. Both a low damage characteristic and a high cleaning power characteristic can be attained by this cleaning power control function. In addition, the aforesaid high-speed gas flow enables the cleaning power to be applied to all the portions at the surface of any small structure formed at the surface of the wafer 2, resulting in an efficient physical cleaning action for any small semiconductor structure. Such a cleaning action cannot be attained due to surface tension in the case of wet cleaning.

Figure 7:
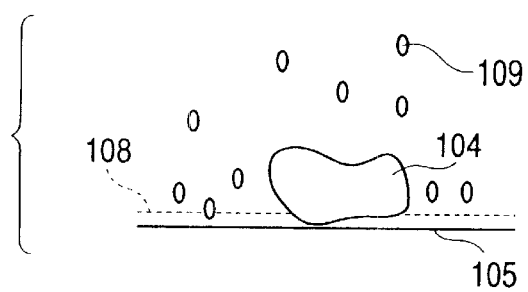
FIG. 7 is a view showing one example of cleaning with plasma.
Figure 8:
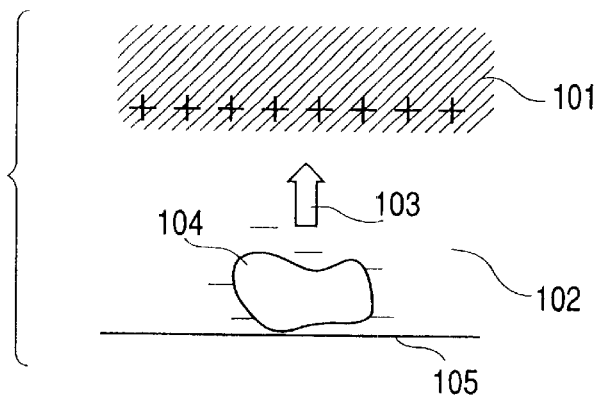
FIG. 8 is an illustrative view showing another example of cleaning with plasma.
Figure 9:
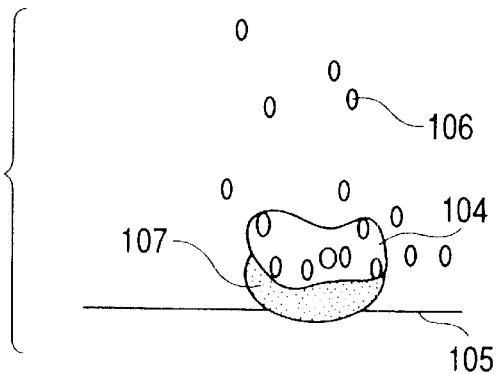
FIG. 9 is an illustrative view showing still another example of cleaning with plasma.

Referring to FIGS. 7, 8 and 9, the function of the plasma generating means 9 will be described. In FIGS. 7, 8 and 9, reference numeral 101 denotes plasma generated by the plasma generating means 9, reference numeral 102 denotes an ion sheath formed between the plasma 101 and the surface 105 of the wafer, and reference numeral 103 denotes a suction force acting against a particle 104 present on the wafer surface 105, respectively. Reference numeral 106 denotes a radical of either oxygen or ozone, reference numeral 107 denotes a chemical adsorbed portion of the particle 104 to the wafer surface 105, reference numeral 108 denotes a wafer surface before cleaning operation, and reference numeral 109 denotes a halogen radical, respectively.

The function of the generated plasma 101 shown in FIGS. 7, 8 and 9 consists in dampening an adsorbing power of particle 104 against the wafer surface 105 to assist in the removal of the particle. Removal is difficult only the physical cleaning action by a pad.

At first, a lift-off function shown in FIG. 7 will be described. In the preferred embodiment, a mixture gas of Ar and $CF_4$ is supplied to the plasma generating means 9 in addition to Ar gas supplied from the pad. This $CF_4$ gas is dissociated into high reactive components (halogen radicals) 109 such as F and $CF_3$ through generation of the plasma 101. These active components 109 etch (lift off) a small amount of either silicon or silicon oxide film at the surface 105 of the wafer to cause the particles 104 melted into or embedded in the surface 105 of the wafer to be easily removed and the physical cleaning power attained by the pad is increased. In the preferred embodiment, the dissociated component of $CF_4$ gas has been applied as the dissociated component 109. It is apparent, however, that a similar lift-off effect can be attained if dissociated substances such as $C_2F_6$, $C_3F_8$, $C_{12}$, $F_2$, HF, ammonia and hydrogen gas and the like are applied.

FIG. 8 illustrates a mechanism for dampening the adsorbing power of particles 104 electrostatically with the plasma 101. At the surface 105 of the wafer, after passing through the semiconductor manufacturing process, under application of plasma such as a plasma etching or a plasma sputtering is produced an electrostatic adsorption of the particle 104 caused by a charging phenomenon. This electrostatic adsorbing power is dampened with the electric charge carried by the low-density plasma 101 generated by the plasma generating means of the present invention, and the cleaning power provided by the physical cleaning action with the pad can be increased.

FIG. 9 is a view for illustrating a mechanism for dampening an adsorbing power in the case that the particle 104 is chemically adsorbed to the surface 105 of the wafer. Normally, in the case that the particle 104 is chemically adsorbed to the surface 105 of the wafer, an oxidization reaction is generated at a contact surface between the particle 104 and the surface 105 of the wafer. That is, some electrons are received or given between the particle 104 and the surface 105 of the wafer to generate the chemical adsorbing power. In view of this fact, oxygen gas is supplied to generate plasma, resulting in that a high oxidizing active component 106 such as either ozone or oxygen radicals and the like is generated. The active component 106 is adsorbed into the particle 104 and the exchanging of electrons (giving or receiving) is transferred from between the particle and the surface of the wafer to between the particle and the active component, resulting in the aforesaid chemical adsorbing power being dampened. Further, a similar effect can be attained by applying either nitrogen or hydrogen in place of the aforesaid oxygen or a mixture gas of these oxidizing and reducing gases including the aforesaid oxygen. In addition, since the particles adsorbed onto the wafer are adsorbed in various forms, each of the cleaning auxiliary actions indicated in FIGS. 7, 8 and 9 is not independently applied, but applied in a merged state to enable some particles to be removed.

Some problems found in the wet cleaning method can be solved due to the fact that a highly efficient cleaning of the wafer can be carried out in a vacuum region by a physical action with the aforesaid pad, and both a chemical action and an electrical action with plasma. In particular, a cleaning effect can be effectively realized with small structures and it becomes possible to manufacture a semiconductor device at a low cost and under a high yield by a method wherein a dry cleaning method of the present invention is applied in the manufacturing of the semiconductor device having a small structure with a size of less than 0.2 μm.

In the aforesaid preferred embodiment, there has been described a preferred embodiment in which a physical cleaning action caused by the pad 5 is assisted by the reactive characteristic of plasma. A similar chemical action can be attained also by applying a light source of ultraviolet rays in place of the plasma generating means 9 and exciting the reactive gas fed into the vacuum state with ultraviolet rays fed from the light source as another preferred embodiment and the physical cleaning action with the pad 5 can be assisted. In another preferred embodiment of the present invention, fluoric acid vapor or a mixture gas of fluoric acid and water vapor is used in place of plasma, whereby the lift-off of the silicon or silicon oxide film can be realized and the physical cleaning action with the pad 5 can be assisted. In addition, the cleaning capability can also be increased by applying an ultrasonic wave to either the wafer 2 or the pad 5. Further, it is also possible to clean both front and rear surfaces of the wafer by repositioning the wafer in the wafer mounting means so that opposite surfaces alternately face the pad.

(Preferred Embodiment 2)

Figure 10:
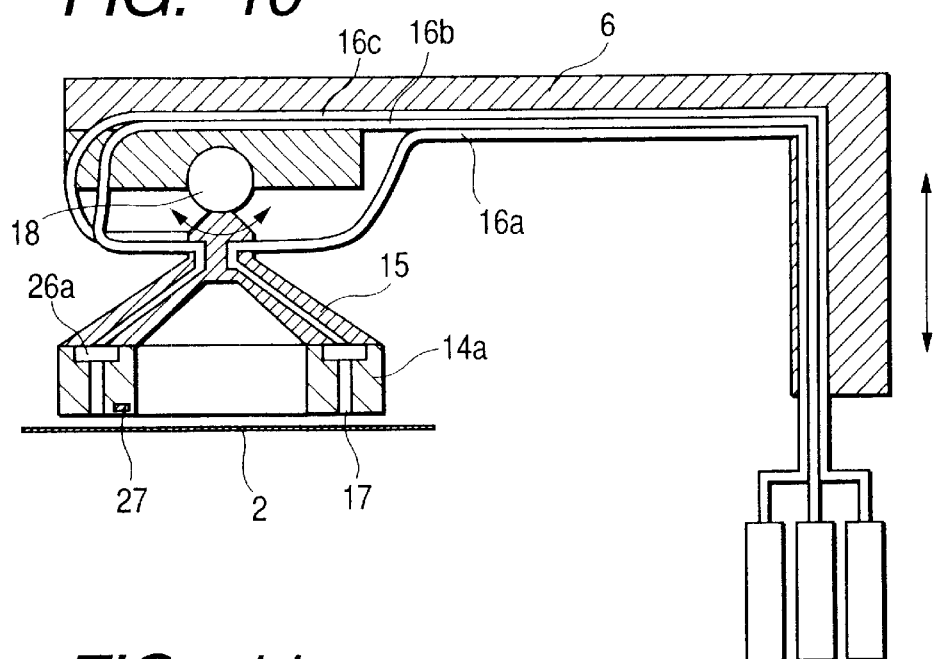
FIG. 10 is an illustrative view showing a pad in a preferred embodiment 2 of the present invention.
Figure 11:
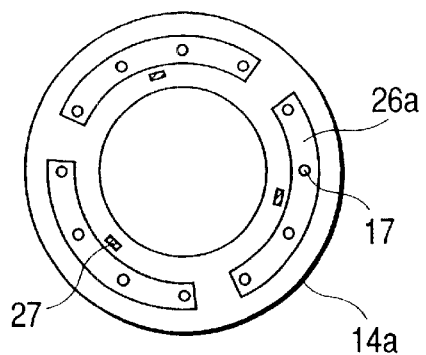
FIG. 11 is a view showing a pad in a preferred embodiment 2 as seen from a bottom thereof.

As described above, it is important to control an inclination angle between the pad 5 and the wafer 2. In the preferred embodiment 2, an example of a construction of a pad is shown in which an inclination angle between the pad and the wafer can be controlled by the use of a plurality of gas feeding passages, in each of which flow rates can be controlled independently. FIG. 10 is illustrates such a construction of the pad. The pad has three gas feeding passages 16a, 16b, 16c in three systems, in each of which the gas flow rate can be controlled independently. Each of the gas feeding passages is branched into a plurality of gas injection ports 17 by supply passages 26a arranged in the pad 14a so that the gas injection ports communicate with the clearance or space between the pad 14a and the wafer 2. FIG. 11 is a view showing the bottom of the pad 14a. The supply passages 26a are divided into three segments in correspondence with the gas flow passages in the three systems. Each of the flow rates of gas flowing in the three gas flow passages in three systems is controlled whereby an inclination angle between the pad 14a and the wafer 2 (an angle formed by a major horizontal plane of the pad and a major horizontal plane of the wafer) can be controlled. In the example of embodiment 2, a plurality of distance sensing electrodes 27 are embedded in the pad 14a as shown in FIGS. 10 and 11. The electrostatic capacitance between the electrodes and the wafer is measured to determine the distance between the pad 14a and the wafer 2. The gas flow rate to any of the gas flow passages may be changed to change the angle of the pad 14a with respect to the wafer 2. This correction of the inclination angle can be achieved by using a piezo-electric element, a spring and a resilient member and the like in place of the aforesaid gas flow rate control.

(Preferred Embodiment 3)

A preferred embodiment 3 of the invention is illustrated in FIG. 2 wherein, a pad is constructed such that a distance between the pad 14 and the wafer 2 is directly measured and the pad 14 is moved in reference to the measured value to control an inclination angle between the pad and the wafer. Other portions of preferred embodiment 3 are similar to those of preferred embodiment 1.

Figure 12:
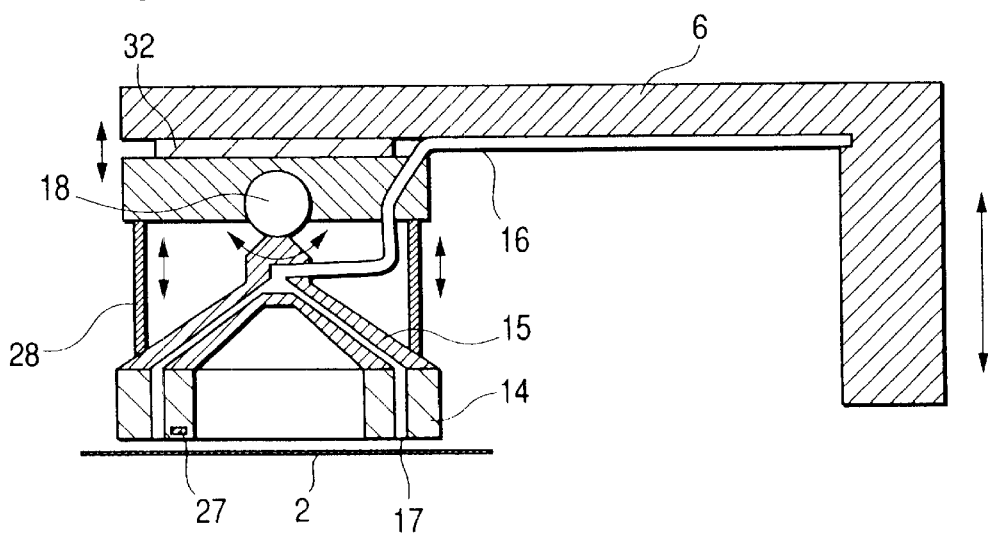
FIG. 12 is a view showing a pad in a preferred embodiment 3 of the present invention.

In preferred embodiment 3 shown in FIG. 12, the distance between the pad 14 and the wafer 2 is directly measured by corresponding elongation or shrinkage of a space control means or section 32 comprised of a piezo electric element and which is positioned between supporting section 6 and pad control section 18. The space control performed by the space control section 32 is carried out by a method wherein the pad 14 is moved towards or away from the wafer 2 by the actuator 7 by an up-and-down motion thereof. The space between the pad 14 and the wafer 2 is measured by the distance sensing electrodes 27 embedded in the pad 14. A plurality of distance sensing electrodes 27 are mounted on a circumferential part of the pad in the same manner as that of preferred embodiment 2, and an inclination angle of the pad 14 with respect to the wafer 2 may also be measured in the same way as with embodiment 2. In order to correct the inclination angle, an inclination correction mechanism 28 based on a signal from a piezo-electric element is a operated. A plurality of inclination correcting mechanisms 28 are mounted on the circumference of the pad to correspond to the distance sensing electrodes 27 and an inclination of the pad 14 can be mechanically corrected in response to their elongation and shrinkage. Although in the present example of configuration, a piezo-electric element is used with the space control section 32 and the inclination correction mechanisms 28, a similar effect may also be attained by employing other suitable elongating or shrinking mechanisms such as an air cylinder or the like.

(Preferred Embodiment 4)

Figure 13:
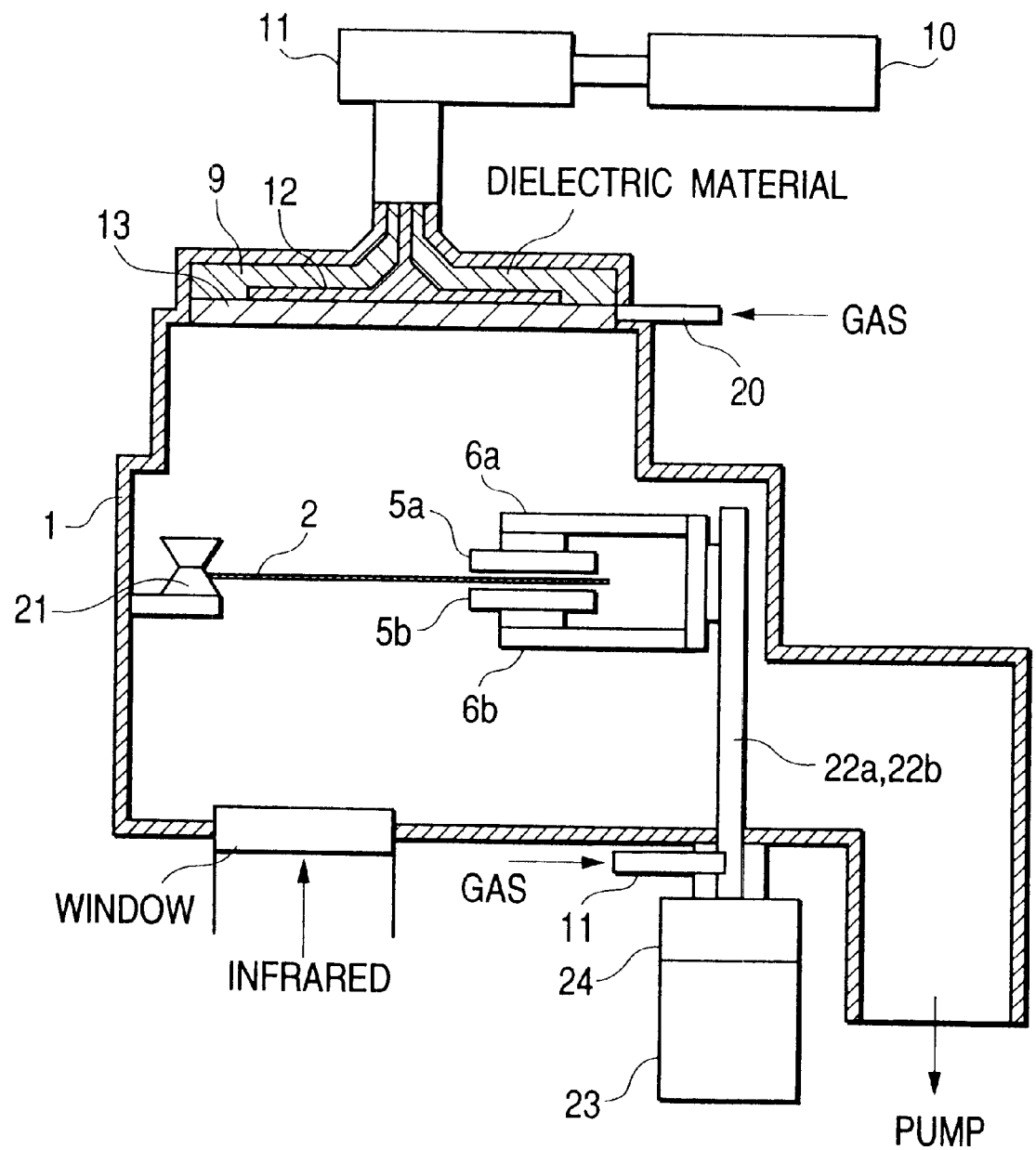
FIG. 13 is a basic configuration view showing a preferred embodiment 4 of the present invention.

In a fourth preferred embodiment shown in FIG. 13, the pads 5 used in the preferred embodiment 1 are mounted on both upper surface and lower surface of the same positions of the wafer 2 to enable both the upper surface and the lower surface to be cleaned concurrently.

Figure 14:
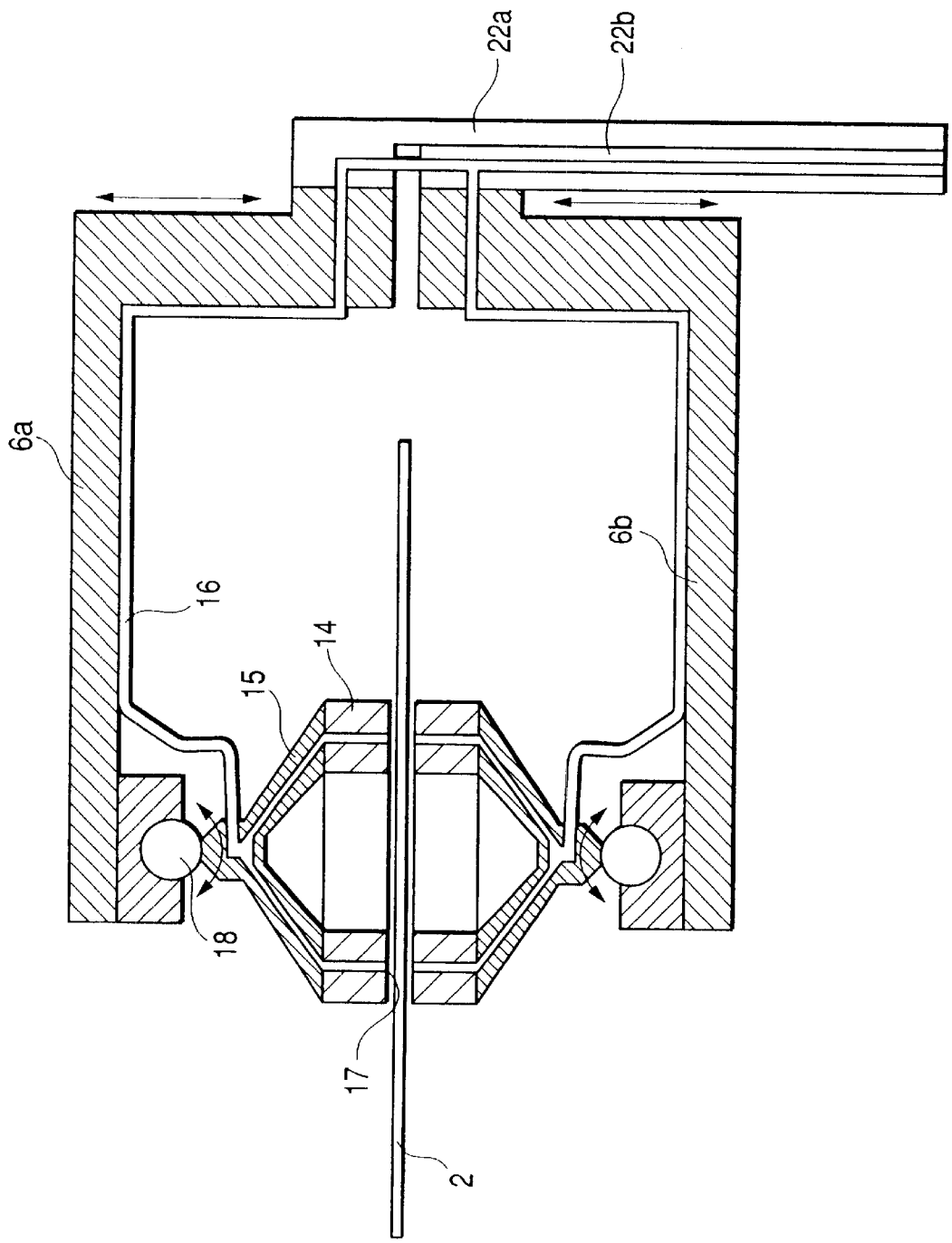
FIG. 14 is a view showing the pads in a preferred embodiment 4 of the present invention.

FIG. 13 illustrates the basic configuration of the dry cleaning device of preferred embodiment 4 and FIG. 14 shows a detailed configuration view of the pad section in the preferred embodiment 4.

Within the vacuum container 1 of embodiment 4, having a vacuum evacuating means, are arranged a wafer mounting means 21 for mounting a wafer 2, a pad 5a mounted on the upper surface of the wafer, a pad 5b mounted on the lower surface of the wafer, supporting sections 6a, 6b, and oscillating shafts 22a, 22b. The pad 5a mounted on the upper surface of the wafer 2 is connected to the oscillating shaft 22a through the supporting section 6a. The pad 5b mounted on the lower surface of the wafer in an upside-down state is connected to the oscillating shaft 22b through the supporting section 6b. An actuator 23 controls a relative distance between the oscillating shafts 22a, 22b while moving up and down relative to each other. A pushing force caused by the oscillating shafts 22a, 22b is detected by a weight sensor 24. Further, the actuator 23 enables the swing shafts 22a, 22b to concurrently perform an oscillating motion. The pads 5a and 5b may be of the same material as that of the pad in the preferred embodiment 1. In addition, a plasma generating means 9 using the electromagnetic wave of the same UHF band as that of the preferred embodiment 1 is mounted at the upper part of the vacuum container 1. In addition, as means for heating the wafer 2, infrared ray generating means are provided.

Figure 15:
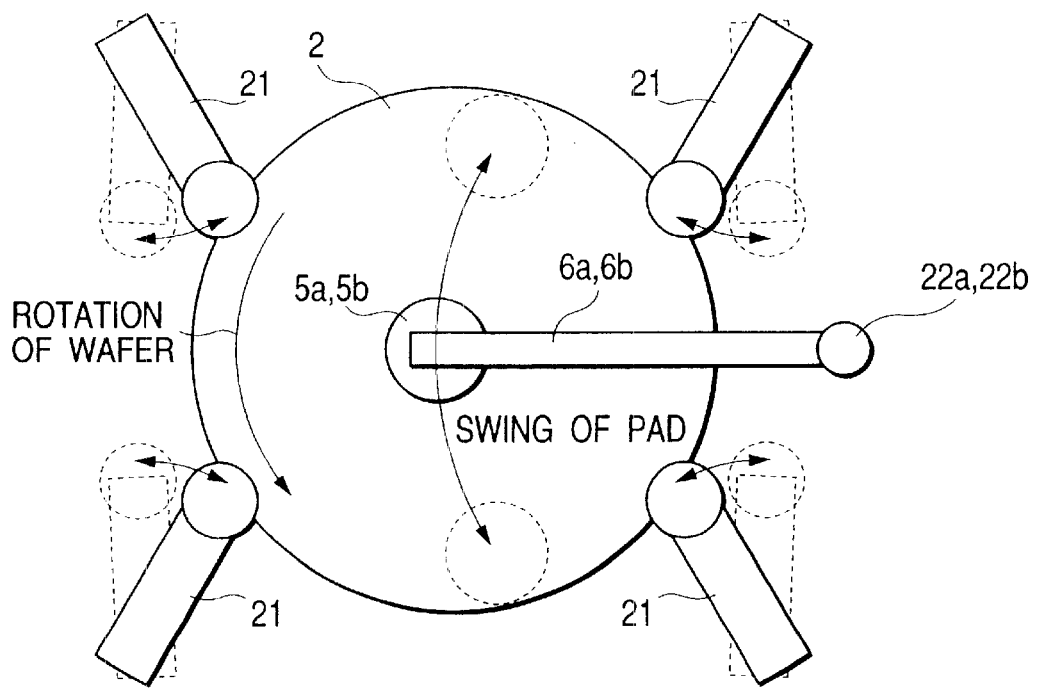
FIG. 15 is a view for showing a wafer mounting means in a preferred embodiment 4.
Figure 16:
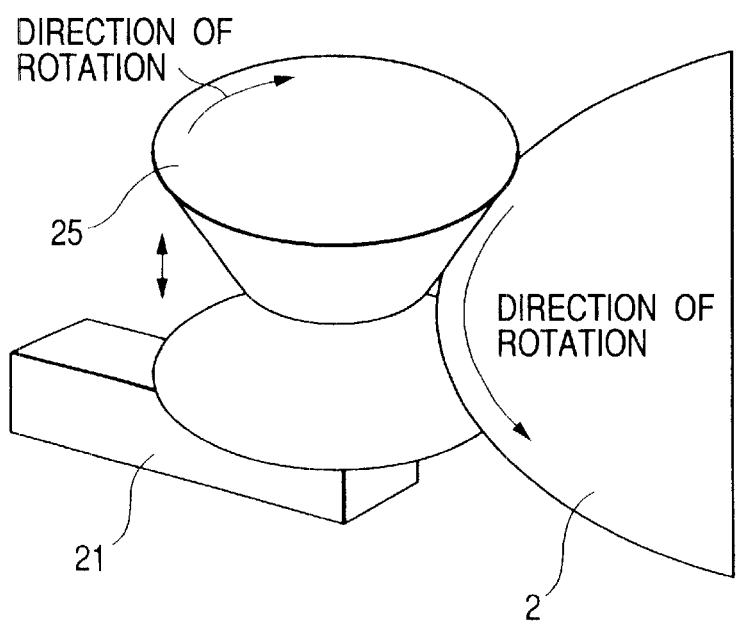
FIG. 16 is a view for showing operation of a wafer mounting means in a preferred embodiment 4.

Details of the wafer mounting method will be described next. In the preferred embodiment, in order to concurrently clean both upper surface and lower surfaces of the wafer 2, it is required to provide a mounting method in which both upper and lower surfaces of the wafer 2 are only contacted with the pads 5a, 5b as much as possible. FIG. 15 shows an arrangement of the wafer mounting means 21 as seen from above the wafer 2. Four wafer mounting means 21 are arranged at positions at an outer circumference of the wafer 2 where they may not interfere with the oscillating motions of the pads 5a, 5b. Each of the four wafer mounting means 21 oscillates to push inwardly and to fix the wafer 2. As shown in FIG. 16, each wafer mounting means 21 is provided with a wafer holding section 25 having frustums of circular cones oppositely faced and overlapping each other, whereby a wafer 2 can be held at an inward notched location. In addition, the wafer holding section 25 can freely move up and down by a small amount and can be aligned with the height of the wafer 2. Further, rotating the wafer holding section 25 enables the wafer 2 itself to be rotated. In addition, even if the orientation of the wafer 2 is changed, a similar effect can be attained. For example, the wafer 2 can be held in a vertical orientation.

A cleaning step in the preferred embodiment 4 is basically similar to that of the previous preferred embodiment 1. In this case, there will be described a method for accessing the pad substantially different from that of the preferred embodiment 4 to the wafer. After the wafer 2 is mounted by the wafer mounting means 21, inside part of the vacuum container 1 is vacuum evacuated by a vacuum evacuating means. Even if the wafer 2 is mounted in the vacuum state after the vacuum evacuation is performed, a similar effect can be attained. Then, the wafer holding section 25 of the wafer mounting means 21 is rotated to cause the wafer 2 to be rotated. After rotation of the wafer 2, the oscillating shafts 22a, 22b are operated to cause the pads 5a, 5b to be moved to a position equally spaced apart above and below the wafer 2. At this time, the pads 5a, 5b are sufficiently spaced apart from the wafer or the wafer mounting means in such a way that the pads 5a, 5b may not strike against the wafer 2 or the wafer mounting means 21. After the pads 5a, 5b are moved above and below the wafer 2, plasma is generated above the wafer 2 by the plasma generating means 9 and concurrently the pads 5a, 5b are pushed towards each other with an inter-face distance between each of the pads 5a, 5b being narrowed while the pads 5a, 5b approach opposite surfaces of the wafer 2. Since the wafer holding section 25 can be moved up and down by a small amount, the wafer 2 is moved to a position where the pressure of gas in the space between each of the pads 5a, 5b become equal to each other. In the preferred embodiment, a flow rate of gas injected from the pad 5a and a flow rate of gas injected from the pad 5b are equal to each other, so that the wafer 2 moves to the position where it is an equal distance from each of the pads 5a, 5b. If the pressing forces of the pads 5a, 5b towards each other are detected by an applied weight sensing means 24 and controlled by the actuator 23, the distances between the pads and the wafer can be. If the gas flow rates of gas injected from each of the pads 5a, 5b are set differently from each other, it is possible to make the distances between each of the pads and the wafer 2 different from each other. As described above, the pads 5a, 5b are integrally oscillated over the surface of the wafer 2 in a concurrent manner by the oscillating motion of the actuator 23 while the distance between the wafer 2 and each of the pads 5a, 5b is being controlled. Under the oscillating motion and the rotating motion of the wafer, the pad 5a moves over the entire upper surface of the wafer 2 and the pad 5b moves over the entire lower surface of the wafer, respectively.

In preferred embodiment 4, although pads having the same structure are used at the upper surface side and the lower surface side of the wafer 2, a similar effect can be attained if the pads having different structures from each other are used. In addition, although the plasma generated by the plasma generating means 9 is generated only above the wafer 2 in the preferred embodiment, it is also possible to arrange the plasma generating means 9 below the wafer in accordance with the type of particle left on the lower surface of the wafer 2. Further, it is possible to clean the surface of each of the pads 5a, 5b to be moved towards the surface of the wafer 2 by moving the pads 5a, 5b towards each other while gas is being injected from the gas injection port 17 under a state in which the wafer 2 is not present.

(Preferred Embodiment 5)

Figure 17:
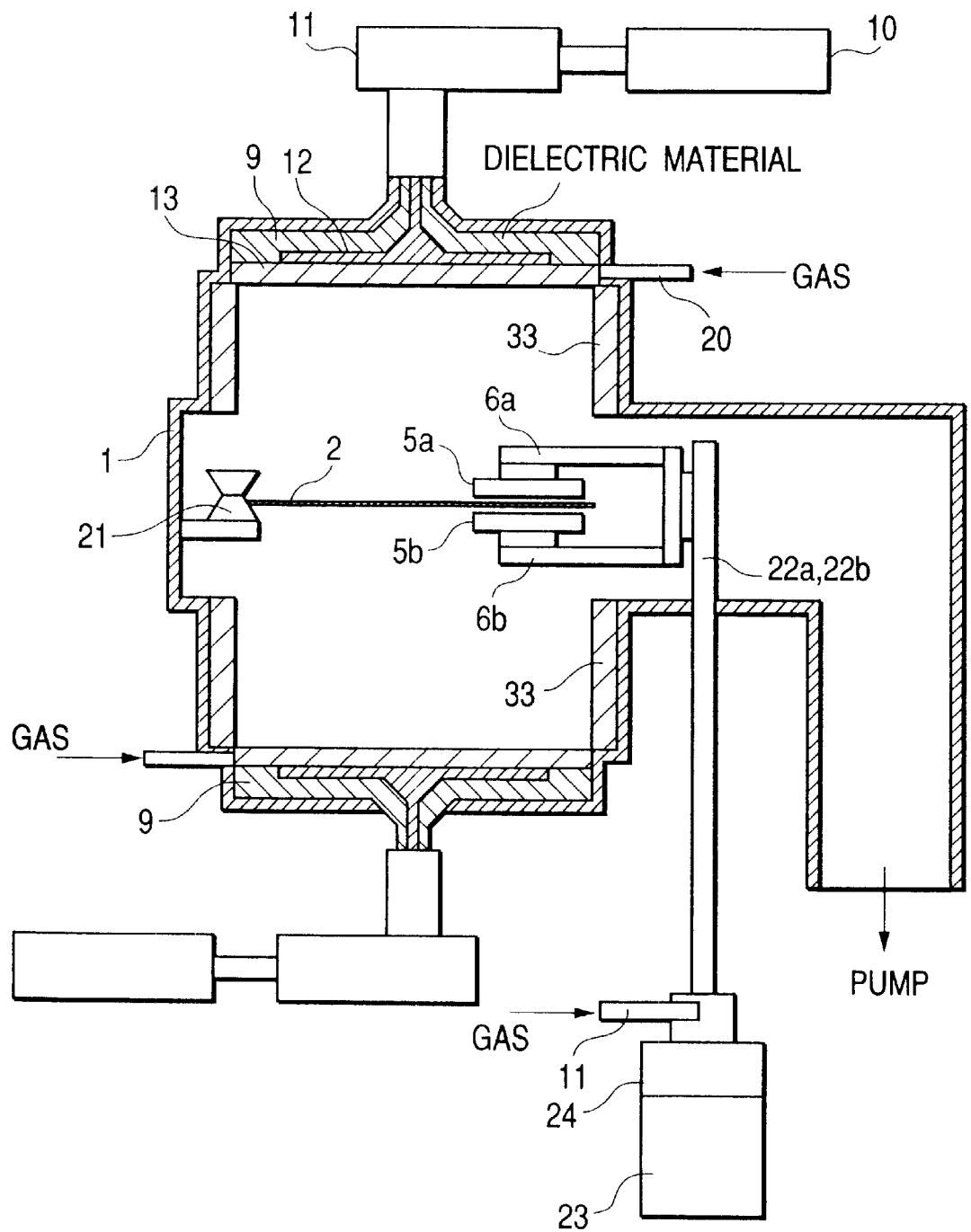
FIG. 17 is a view showing a preferred embodiment 5 of the present invention.
Figure 18:
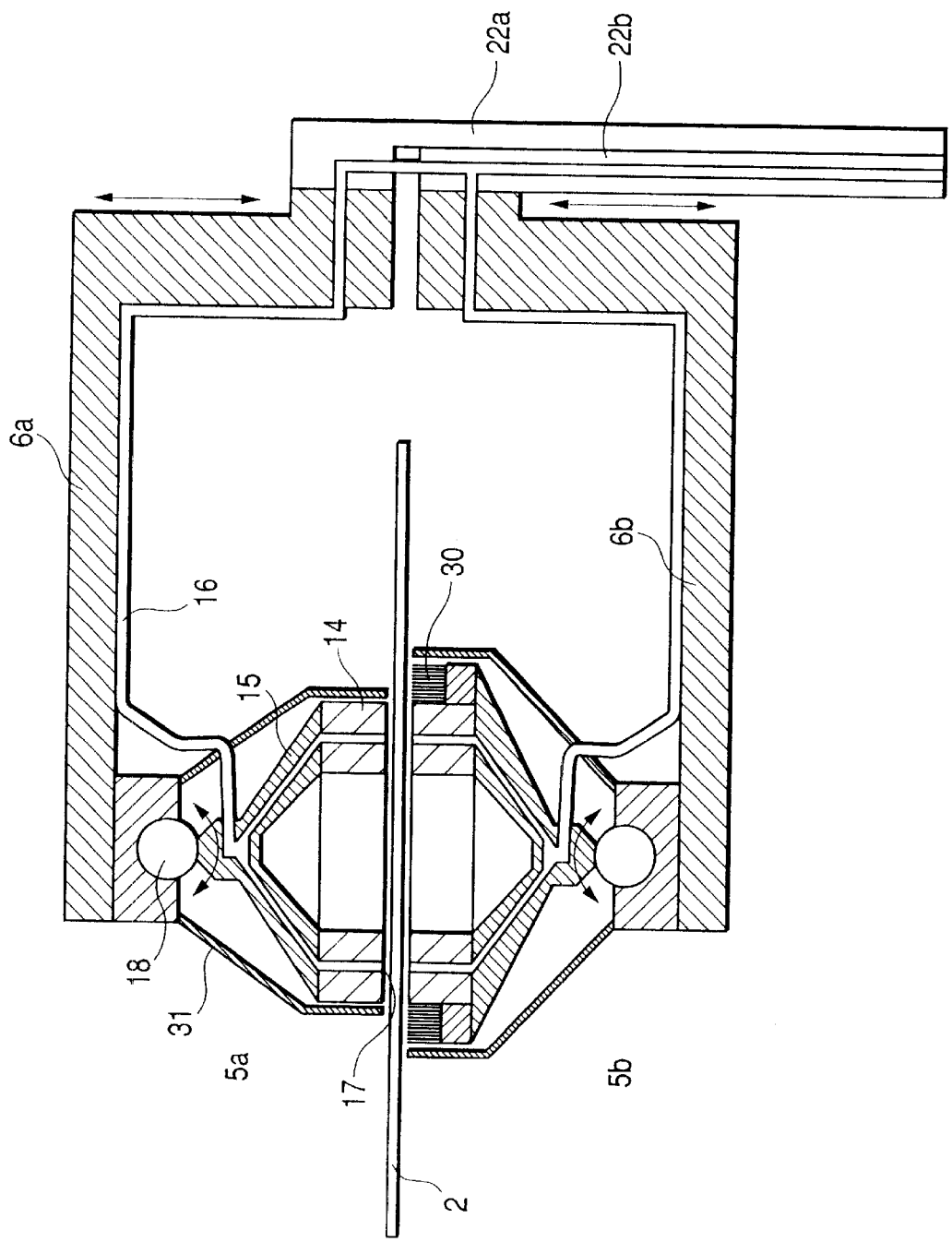
FIG. 18 is a view showing a pad in a preferred embodiment 5 of the present invention.

In FIG. 17 is shown an illustration of a preferred embodiment 5 and in FIG. 18 is shown an illustration of the pads in the preferred embodiment. The preferred embodiment 5 shows a device for cleaning both upper and lower surfaces of the wafer 2 concurrently in the same manner as that of the previous embodiment 4, wherein the plasma generating means having the same configuration to each other are arranged both above and below the wafer 2, so that the cleaning effect of the plasma occurs not only on the upper surface of the wafer 2, but also the lower surface of the wafer 2. Further, the pad for cleaning the lower surface of the wafer 2 is provided with a brush 30. In the case that the pads are pushed against the wafer 2 from both the upper surface side and the lower surface side, the wafer 2 can not be kept at a specified position unless both surface sides are pushed by an equal force. In view of the foregoing, in preferred embodiments, a mechanism for performing a mechanical cleaning with the brush 30 is applied at the rear surface while the pushing forces from both front and rear surfaces of the wafer at the pads 14 are being balanced. Further, a plasma shield 31 is mounted adjacent the pads to prevent influence of the plasma against the pads. Since the pads are separated from the plasma by this plasma shield 31, it is possible to prevent the pads from being damaged or particles from being generated. In addition, in order to prevent the particles separated from the wafer 2 from being adhered again to the inner wall surface of the container 1, a wall surface temperature control means 33 is provided to control a temperature of the inner wall surface of the container 1 to 200° C. As to other structural portions, they are similar to those of the preferred embodiment 4. In accordance with the preferred embodiment 5, it becomes possible to improve the cleaning capability on the lower surface of the wafer 2.

[Effects of the Invention]

The dry cleaning technology of the present invention enables a semiconductor device having an ultra-small structure of about 0.1 $\mu$m to be manufactured at a low cost and in a precise manner.

What is claimed is:

1. A dry cleaning apparatus for cleaning a wafer, comprising:
   a container having a vacuum evacuating means for evacuating the container;
   a wafer mounting means;
   a least one pad arranged near a surface of the wafer;
   means for supplying gas in a space between said pad and said wafer from at least one gas injection port provided in said pad;
   means for controlling a separation distance of said space between said pad and said wafer; and
   means for moving said pad and said wafer relative to each other, wherein:
   particles on said surface of the wafer are removed by a flow of gas supplied by said gas supplying means through said at least one gas injection port.

2. A dry cleaning apparatus according to claim 1, further comprising:
   a second gas supplying means for injecting gas from another gas injection port or a plurality of gas injection ports separate from said gas supplying means arranged in said pad, into the container.

3. A dry cleaning apparatus according to claim 2, further comprising:
   means for generating plasma in said container and dissociating said gas supplied from said second gas supplying means into high reactive components.

4. A dry cleaning apparatus according to claim 3, wherein:
   said plasma is formed by an electromagnetic wave in any one of a micro-wave band, a UHF band or a radio frequency wave band.

5. A dry cleaning apparatus according to claim 4, which further comprises:
   means for applying a magnetic field to said electromagnetic wave.

6. A dry cleaning apparatus according to claim 3, wherein:
   said wafer is mounted in a diffusion area of said plasma.

7. A dry cleaning apparatus according to claim 1, wherein:
   means for controlling said separation distance between said pad and said wafer constitutes means for controlling a flow rate of gas supplied in said space between said pad and said wafer whereby a force is created between said pad and said wafer.

8. A dry cleaning apparatus according to claim 7, further comprising:
   means for measuring said force between said pad and said wafer.

9. A dry cleaning apparatus according to claim 1, wherein:
   said means for controlling said separation distance between said pad and said wafer is comprised of a mechanism for causing relative movement between said pad and said wafer, and means for measuring said separation distance between said pad and said wafer.

10. A dry cleaning apparatus according to claim 1, wherein:
    said means for supplying gas into said space between said pad and said wafer is comprised of a gas injection port in a central part of said pad.

11. A dry cleaning apparatus according to claim 1, wherein:
    said means for supplying gas into said space between said pad and said wafer is comprised of a plurality of gas injection ports arranged at a peripheral part of said pad.

12. A dry cleaning apparatus according to claim 1, wherein:
    said pad has a gas discharging port for discharging gas present in said space between said pad and said wafer.

13. A dry cleaning apparatus according to claim 1, wherein:
    a size of said pad is smaller than that of said wafer.

14. A dry cleaning apparatus according to claim 1, wherein:
    a material at a plane of said pad near said wafer has a lower hardness than that of said wafer.

15. A dry cleaning apparatus according to claim 1, wherein:

a material at a plane of said pad near said wafer can be deformed into a corrugated shape by a pressure of gas present in said space between said pad and said wafer.

16. A dry cleaning apparatus according to claim 1, wherein:

a material at a plane of said pad near said wafer is comprised of one or a combination of TEFLON, polyvinyl alcohol, DELRIN, BESPEL, KAPTON, polyvinyl chloride, polyester, silicon oxide, silicon or aluminum oxide.

17. A dry cleaning apparatus according to claim 1, wherein:

a plane of said pad near said wafer is flat and smooth.

18. A dry cleaning apparatus according to claim 1, wherein:

a material at a plane of said pad near said wafer is porous.

19. A dry cleaning apparatus according to claim 1, wherein:

a part of said pad near said wafer is constructed so as to be easily replaced.

20. A dry cleaning apparatus according to claim 1, further comprising:

a mechanism for cleaning a plane of said pad near said wafer.

21. A dry cleaning apparatus according to claim 1, wherein:

said means for moving said pad and said wafer relative to each other is comprised of means for moving said pad over a surface of said wafer and means for rotating said wafer.

22. A dry cleaning apparatus according to claim 1, wherein:

a wafer holding means is located at an outer circumference of said wafer, and said wafer holding means has a surface at the same height as that of the surface of said wafer.

23. A dry cleaning apparatus according to claim 1, wherein:

said means for moving said pad and said wafer relative to each other includes means having a moving speed which is changed in response to a relative position between said pad and said wafer.

24. A dry cleaning apparatus according to claim 1, further comprising:

means for applying an ultrasonic wave to either said wafer or said pad.

25. A dry cleaning apparatus according to claim 1, further comprising:

means for controlling a temperature of said wafer.

* * * * *